(12) United States Patent
Hokazono et al.

(10) Patent No.: US 7,750,381 B2
(45) Date of Patent: Jul. 6, 2010

(54) SEMICONDUCTOR DEVICE AND METHOD OF MANUFACTURING SEMICONDUCTOR DEVICE

(75) Inventors: Akira Hokazono, Kanagawa-ken (JP); Satoshi Inaba, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 12/052,284

(22) Filed: Mar. 20, 2008

(65) Prior Publication Data
US 2008/0230805 A1    Sep. 25, 2008

(30) Foreign Application Priority Data
Mar. 20, 2007    (JP)    ............................. 2007-072949

(51) Int. Cl.
*H01L 31/062*    (2006.01)
(52) U.S. Cl. ................. 257/288; 257/190; 257/E29.252
(58) Field of Classification Search ................. 257/190, 257/288, E29.252
See application file for complete search history.

(56) References Cited
U.S. PATENT DOCUMENTS
6,743,684 B2    6/2004    Liu

2008/0023752 A1*    1/2008    Chen et al. .................. 257/327

FOREIGN PATENT DOCUMENTS
JP    11068096    3/1999
JP    2000299462    10/2000
JP    2007036205    2/2007

OTHER PUBLICATIONS

Miura, et al., Self-Aligned Pocket Implantation into Elevated Source/Drain MOSFETs for Reduction of Junction Capacitance and Leakage Current, Extended Abstract of Solid State Devices and Materials, pp. 52-53, Sep. 2000.
Office Action dated Sep. 15, 2009, corresponding to U.S. Appl. No. 12/052,284, filed on Mar. 20, 2008.

* cited by examiner

*Primary Examiner*—Tan N Tran
(74) *Attorney, Agent, or Firm*—Turocy & Watson, LLP

(57) ABSTRACT

In one aspect of the present invention, a semiconductor device may include a Si substrate, a gate electrode provided on the semiconductor via a gate dielectric layer, a first epitaxially grown layer provided on the Si substrate, a channel region provided in the Si substrate below the gate electrode, a source/drain region provided in the first epitaxially grown layer sandwiching the channel region, and having a first conductivity type impurity, a second epitaxially grown layer provided between the channel region and the first epitaxially grown layer, and provided below the gate electrode, and having a second conductivity type impurity opposite to the first conductivity type.

6 Claims, 5 Drawing Sheets

SEMICONDUCTOR DEVICE AND METHOD OF MANUFACTURING SEMICONDUCTOR DEVICE

CROSS REFERENCE TO RELATED APPLICATION

This application is based upon and claims the benefit of priority from Japanese Patent Application No. 2007-72949, filed on Mar. 20, 2007, the entire contents of which are incorporated herein by reference.

BACKGROUND

Suppressing a short channel effect in a MISFET (Metal Insulator Semiconductor Field Effect Transistor) is a problem associated with shrinking the size of the MISFET.

One way to suppress the short channel effect is to form a Halo structure in the MISFET.

A MISFET with Halo structure is disclosed in U.S. Pat. No. 6,743,684. In the MISFET in U.S. Pat. No. 6,743,684, the Halo structure is formed by ion implanting an impurity ion into a substrate below a gate electrode.

However, in the MISFET of the art, the impurity ion is implanted in a broad area in the semiconductor substrate, so it is difficult to obtain a Halo structure in the required portion.

So a region where the Halo region and the source/drain region overlap each other may be increased, and a junction leak current may occur and a junction capacitance may be increased.

SUMMARY

Aspects of the invention relate to an improved semiconductor device and a manufacturing method of a semiconductor device.

In one aspect of the present invention, a semiconductor device may include a Si substrate, a gate electrode provided on the semiconductor via a gate dielectric layer, a first epitaxially grown layer provided on the Si substrate, a channel region provided in the Si substrate below the gate electrode, a source/drain region provided in the first epitaxially grown layer sandwiching the channel region, and having a first conductivity type impurity, a second epitaxially grown layer provided between the channel region and the first epitaxially grown layer, and provided below the gate electrode, and having a second conductivity type impurity opposite to the first conductivity type.

In another aspect of the invention, a manufacturing method of semiconductor device may include forming a gate electrode on a Si substrate via a gate dielectric layer, forming a recess in a first part of the Si substrate and a second part of the Si substrate, the first part of the Si substrate being an exposed part of the Si substrate, and the second part of the Si substrate being a part of the Si substrate below the gate dielectric, growing a first epitaxial crystal layer having a first conductivity type impurity on the second part of the Si substrate and a part of the first part of the Si substrate, removing a part of the first epitaxial crystal layer on the first part of the Si substrate, growing a second epitaxial crystal layer on the first part of the Si substrate, forming a source/drain region in the second epitaxial crystal layer having a second conductivity type opposite to the first conductivity type.

In another aspect of the invention, a manufacturing method of semiconductor device may include forming a gate electrode on a Si substrate via a gate dielectric layer, forming a recess in a first part of the Si substrate and a second part of the Si substrate, the first part of the Si substrate being an exposed part of the Si substrate, and the second part of the Si substrate being a part of the Si substrate below the gate dielectric, forming an amorphous layer having a first conductivity type impurity on the second part of the Si substrate and a part of the first part of the Si substrate, providing a heat treatment so as to cause solid phase epitaxial growth from a boundary between the Si substrate and amorphous layer and form a solid phase epitaxially grown layer, removing a part of the solid phase epitaxial grown layer in the first part of the Si substrate, growing an epitaxial crystal layer on the first part of the Si substrate, forming a source/drain region in the second epitaxial crystal layer having a second conductivity type opposite to the first conductivity type.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1:
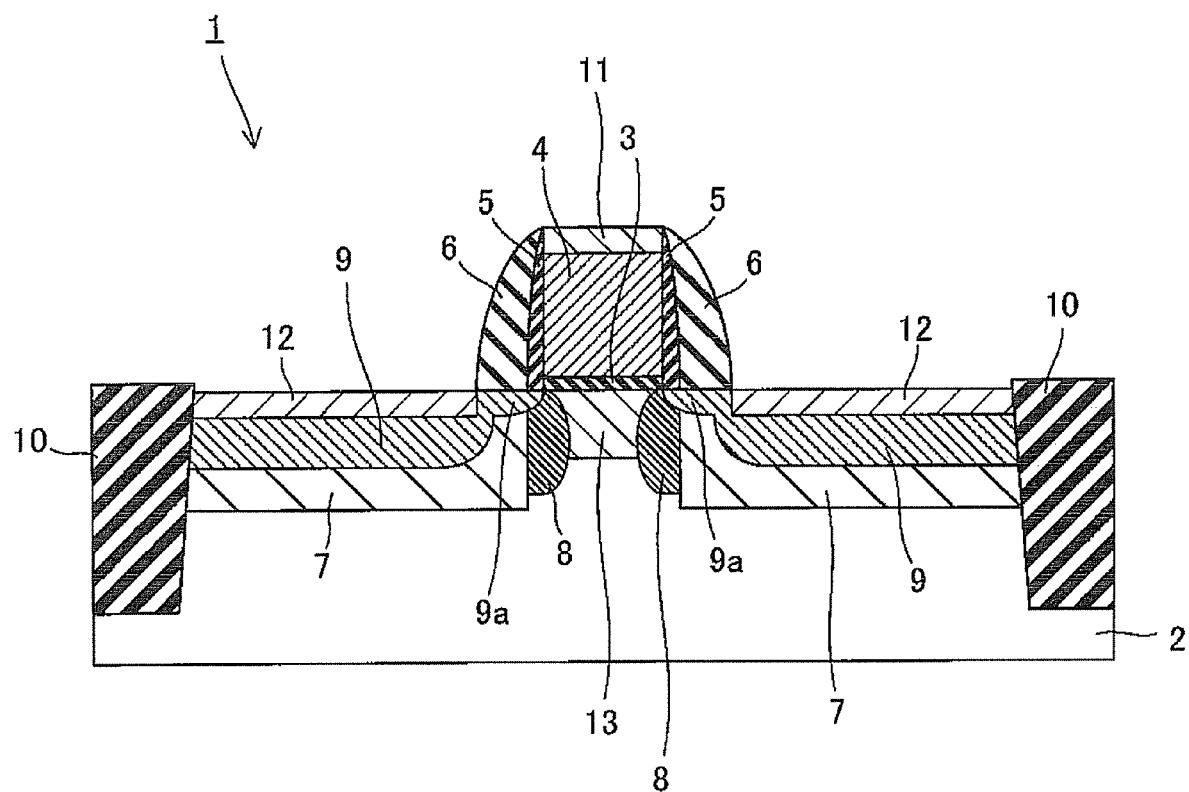
FIG. 1 is a cross sectional view of a semiconductor device in accordance with a first embodiment.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

A first embodiment of the present invention will be explained hereinafter with reference to FIGS. 1-2H.

FIG. 1 is a cross sectional view of a semiconductor device 1 in accordance with a first embodiment.

As shown in FIG. 1, in the semiconductor device 1, a gate electrode 4 provided on a Si substrate 2 via a gate dielectric layer 3, a first silicide layer 11 on the gate electrode 4, an offset spacer 5 on a side surface of the gate electrode 4, a gate sidewall 6 on a side of the offset spacer 5, a channel region 13 below the gate electrode 4 in the Si substrate 2, an epitaxially grown layer 7 on the Si substrate 2 sandwiching the channel region 13, a halo region 8 provided between the channel region and the epitaxially grown layer 7, a source/drain region 9 in the epitaxially grown layer 7, a second silicide layer 12 on the source/drain region 9, and a isolation region (STI: Shallow Trench Isolation) 10 are provided.

The gate electrode 4 may be made of a polycrystalline Si or polycrystalline SiGe including a conductive impurity. The conductive impurity may be a p type impurity ion such as B, $BF_2$ or the like for a p type transistor and an n type impurity ion such as As, P or the like for an n type transistor. The gate electrode 4 may be a metal gate electrode which is made of a metal such as W, Ta, Ti, Hf, Zr, Ru, Pt, Ir, Mo, Al or the like, or a composition having such metals. In the case where the metal gate is provided, the first silicide layer 11 is not provided on the gate electrode 4.

The first gate electrode 11 may be a composition of a Si and a metal such as Ni, Pt, Co, Er, Y, Yb Ti, Pd, NiPt, Co Ni or the like. The first silicide layer 11 is formed by formation of silicide on top of the gate electrode 4, which is polycrystalline Si. However, a full silicide gate electrode may be provided by forming a silicide in the entire gate electrode 4.

The gate dielectric layer 3 may be $SiO_2$, SiN, SiON, or a dielectric layer having a high permittivity material (so called High-K dielectric: Hf based material such as HfSiON, HfSiO and Hf; Zr based material such as ZrSiON, ZrSiO, ZrO; Y based material $Y_2O_3$).

The offset spacer 5 may be $SiO_2$, SiN or the like.

The gate sidewall 6 is made of, for example, a single layered SiN, a two layered structure having SiN and $SiO_2$ or a three layered structure. An offset spacer may be provided between the gate electrode 8 and the gate sidewall 9.

The epitaxially grown layer 7 has a crystal which is larger lattice constant than the Si crystal and configured to provide a compressive stress to the channel region, when the transistor is a p type transistor. For example, a SiGe is used as the epitaxially grown layer 7 in a p type transistor.

On the other hand, the epitaxially grown layer 7 has a crystal which has a smaller lattice constant than the Si crystal and configured to provide a tensile stress to the channel region, when the transistor is an n type transistor. For example, a SiC or epitaxially grown Si on Si substrate is used as the epitaxially grown layer 7 in an n type transistor.

The epitaxially grown layer 7 does not contain a conductive impurity ion.

The Halo region 8 has a crystal which is larger lattice constant than the Si crystal and configured to provide a compressive stress to the channel region, when the transistor is a p type transistor. For example, a SiGe is used as the Halo region 8 in a p type transistor.

The Halo region 8 has a crystal which has a smaller lattice constant than the Si crystal and configured to provide a tensile stress to the channel region, when the transistor is an n type transistor. For example, a SiC or epitaxially grown Si on Si substrate is used as the Halo region 8 in an n type transistor.

The Halo region 8 contains a conductive impurity ion.

It may be preferable that the Ge concentration of SiGe in the epitaxially grown layer 7 and Halo region 8 is 10-30 atom %. When the Ge concentration is less than 10 atom %, the stress to the channel may be small. When the Ge concentration is more than 30 atom %, the crystal defect in the epitaxially grown layer 7 and Halo region 8 may be large.

It may be preferable that the C concentration of SiC in the epitaxially grown layer 7 and Halo region 8 is no more than 3 atom %. When the C concentration is more than 3 atom %, the crystal defect in the epitaxially grown layer 7 and Halo region 8 may be large.

The source/drain region 9 and the extension region 9a is formed by, for example, implanting a p type impurity ion such as B, $BF_2$ or the like into the Si substrate 2.

The STI 10 may be made of $SiO_2$, and the bottom is provided with a depth of 200-350 nm.

Next, a manufacturing process of the semiconductor device in accordance with the first embodiment will be explained hereinafter with reference to FIGS. 2A-2H.

Figure 2A:
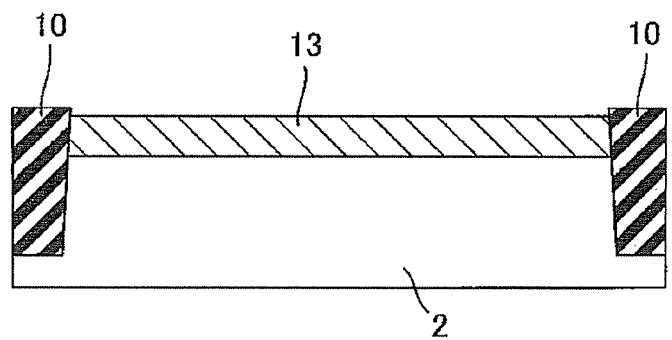
FIGS. 2A-2H are cross sectional views showing a manufacturing process of the semiconductor device in accordance with a first embodiment.

As shown in FIG. 2A, the STI 10 is formed in the Si substrate 2. A well (not shown) and the channel region 13 are formed by implanting ions in the Si substrate 2. Subsequently, a heat operation such as RTA (Rapid Thermal Anneal) is provided and the implanted impurity ions are activated.

For forming a p type transistor, the n type well is formed by implanting P (phosphorus) with an implantation energy of 500 keV and an implantation amount of $3.0 \times 10^{13}$ cm$^{-2}$, and the channel region is formed by implanting B with an implantation energy of 10 keV and an implantation amount of $1.5 \times 10^{13}$ cm$^{-2}$.

For forming an n type transistor, the p type well is formed by implanting B (boron) with an implantation energy of 260 keV and an implantation amount of $2.0 \times 10^{13}$ cm$^{-2}$, and the channel region is formed by implanting As with an implantation energy of 80 keV and an implantation amount of $1.0 \times 10^{13}$ cm$^{-2}$.

Figure 2B:
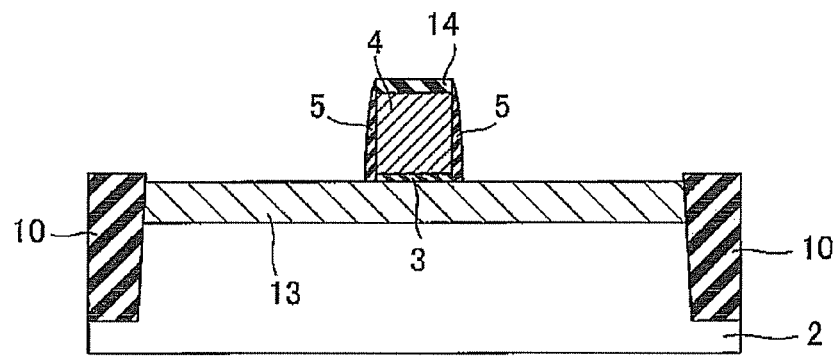

As shown in FIG. 2B, the gate dielectric layer 3, the gate electrode 4, the cap layer 14, and the offset spacer 5 are formed on the Si substrate 2.

The gate dielectric layer 2, the gate electrode 4, the cap layer 14 and the offset spacer are formed as follows.

Figure 2C:
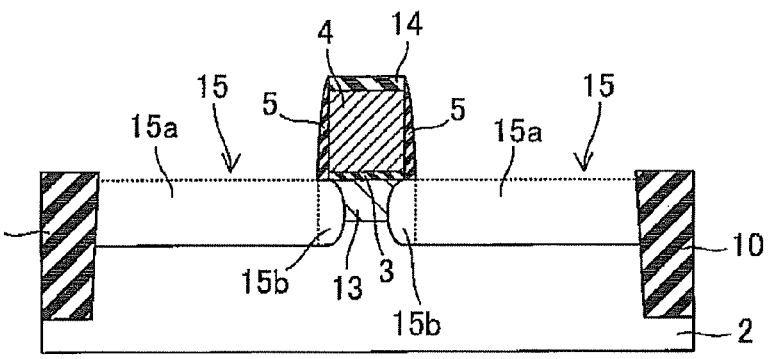

A precursor of the gate dielectric layer (e.g. $SiO_2$, 0.5-6 nm) 2, the gate electrode (e.g. polycrystalline Si, 50-200 nm) 4, the cap layer (e.g. SiN, 20-80 nm) 14 are formed by thermal oxidation, LPCVD or the like. Subsequently, the precursor of the gate dielectric layer 2, the gate electrode 4, and the cap layer 14 are patterned using lithography, RIE and the like. Consequently, the gate dielectric layer 2, the gate electrode 4, and the cap layer 14 are provided. After, a $SiO_2$ having a thickness of 0.1-0.2 nm is formed on an exposed surface of the gate dielectric layer 2, the gate electrode 4, and the cap layer 14 by thermal oxidation. A precursor of the off set spacer 5 having a thickness of 3-12 nm is formed on the $SiO_2$. And RIE is provided, so the offset spacer 5 is obtained. As shown in FIG. 2C, the recess 15 is formed by removing the upper part Of the Si substrate 2 with the offset spacer 5, cap layer 14 and the STI 10 as a mask for etching. In this case, the etching proceeds in a lateral direction in the Si substrate 2. As a result, the recess 15 is also provided below the gate electrode 4.

The recess 15 in the Si substrate 2 has a first region 15a and a second region 15b. The first region 15a is a region below an exposed part of Si substrate 2. The second region 15b is a region below the gate electrode 4 and the offset spacer 5 and adjacent to the first region 05a.

Figure 2D:
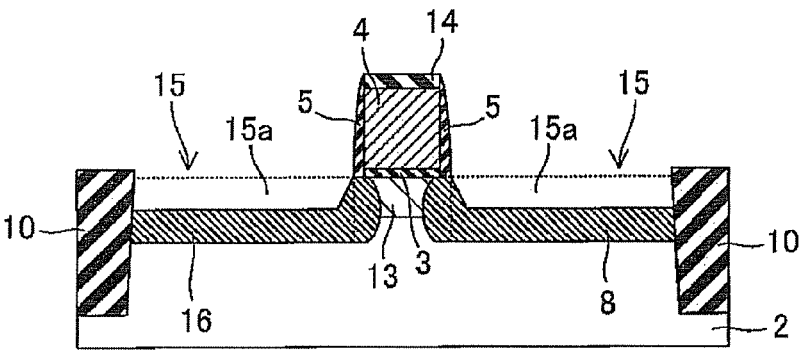

As shown in FIG. 2D, an impurity containing layer 16 which is a SiGe having a conductivity ion, is formed on the recess 15. The impurity containing layer 16 is epitaxially grown on the Si substrate 2. The impurity containing layer 16 is provided on the second region 15b of the Si substrate 2 and a part of the first region 15a of Si substrate 2.

The second region 15b may not be filled with the impurity containing layer 16. At the least, a part of the impurity containing layer 16 is provided below the gate electrode 4 or the offset spacer 5.

The epitaxial growth is provided in a chemical chamber.

For forming a p type transistor, the impurity containing layer 16, which includes As in a SiGe crystal, is formed by a vapor phase epitaxial growth in a hydrogen ambient with a gas containing Si such as monosilane ($SiH_4$) or dichlorosilane ($SiHCl_2$), and a gas containing Ge such as a germanium tetrahydride ($GeH_4$), and a gas containing As such as Arsine ($AsH_3$) at 700-850 Centigrade.

For forming an n type transistor, the impurity containing layer 16, which includes B in a SiGe crystal, is formed by a vapor phase epitaxial growth in a hydrogen ambient with a gas containing Si such as monosilane (SiH$_4$) or dichlorosilane (SiHCl$_2$), and a gas containing Ge such as a germanium tetrahydride (GeH$_4$), and a gas containing B such as diborane (B$_2$H$_6$) at 700-850 Centigrade.

Figure 2E:
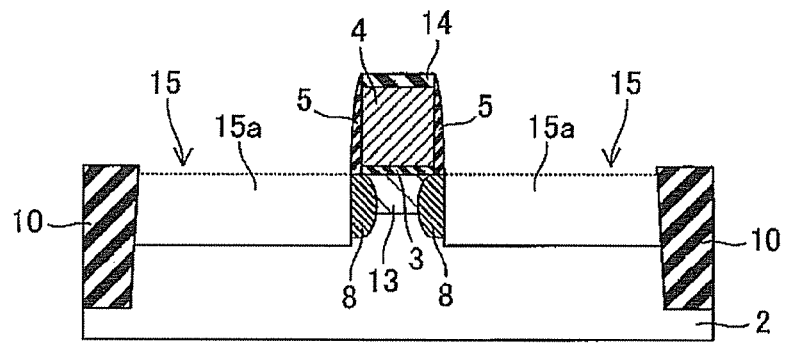

As shown in FIG. 2E, a part of the impurity containing layer 16 in the first region 15a of the recess 15 is removed by anisotropic etching using the offset spacer 5, the cap layer 14 and the STI 10 as a mask. As a result, the impurity containing layer 16 is provided in the second region 15b of the recess 15. Namely, the impurity containing layer 16 is provided below the gate electrode 4 and the offset spacer 5. Thus, Halo region 8, which is the processed impurity containing layer 16, is formed below the gate electrode 4.

Figure 2F:
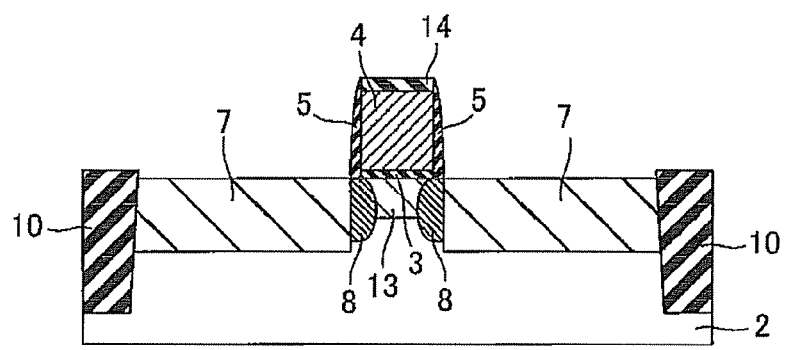

As shown in FIG. 2F, the epitaxially grown layer 7 is provided on the first region 15a of recess 15 on the Si substrate 2. The epitaxially grown layer 7 does not have a conductive impurity ion. The epitaxially grown layer 7 is epitaxially grown on the Si substrate 2.

The epitaxial growth is provided in a chemical chamber.

For forming a p type transistor, the epitaxially grown layer 7, which has a SiGe crystal, is formed by vapor phase epitaxial growth in a hydrogen ambient with a gas containing Si such as monosilane (SiH$_4$) or dichlorosilane (SiHCl$_2$), and a gas containing Ge such as a germanium tetrahydride (GeH$_4$) at 700-850 Centigrade.

For forming an n type transistor, the epitaxially grown layer 7, which has a SiGe crystal, is formed by vapor phase epitaxial growth in a hydrogen ambient with a gas containing Si such as monosilane (SiH$_4$) or dichlorosilane (SiHCl$_2$), and a gas containing Ge such as a germanium tetrahydride (GeH$_4$) at 700-850 Centigrade.

Figure 2G:
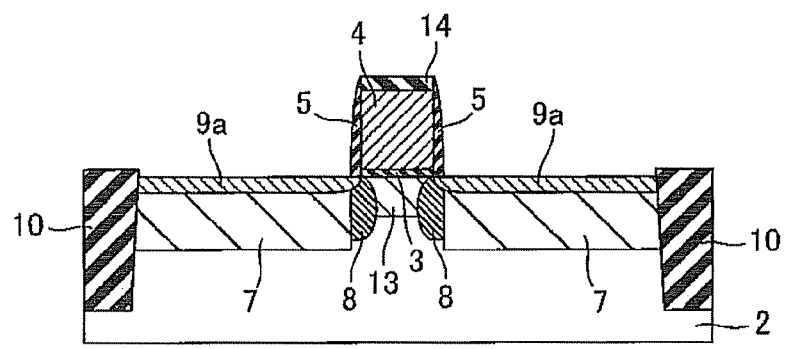

As shown in FIG. 2G, the source/drain extension region 9a is formed by implanting conductive ions into the epitaxially grown layer 7 and the Halo region 8 using the offset spacer 5 as a mask edge. Subsequently, a heat operation such as RTA or the like is provided for activating the implanted impurity ions.

For forming a p type transistor, BF$_2$ or B is implanted with an implantation energy of 1-3 keV and an implantation amount of $5.0 \times 10^{14}$-$1.5 \times 10^{15}$ cm$^{-2}$.

For forming an n type transistor, As is implanted with an implantation energy of 1-5 keV and an implantation amount of $5.0 \times 10^{14}$-$1.5 \times 10^{15}$ cm$^{-2}$.

The ion implantation is provided with a direction angled (for example 20 degrees) from the vertical direction to the top surface of the Si substrate 2. Furthermore, the ions are diffused in the epitaxially grown layer 7 and Halo region 8. As a result, the source/drain extension region 9a is provided below the offset spacer 5. It is preferable that the edge of the source/drain extension region is provided in the Halo region 8.

Figure 2H:
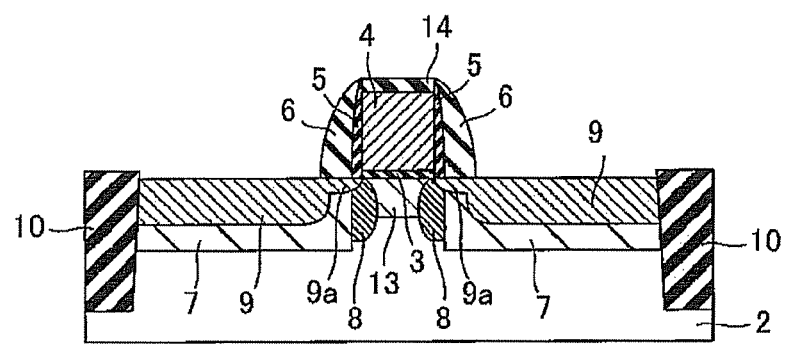

As shown in FIG. 2H, the source/drain region 9 is provided in the epitaxially grown layer 7 and Halo region 8, after gate sidewall 6 is formed on the Si substrate 2. The source/drain region 9 is formed by implanting a conductivity impurity ion using the gate sidewall 6 as a mask edge. The conductivity impurity ion is the same conductivity type as the source/drain extension region 9a. Subsequently, a heat treatment such as RTA is provided.

For forming a p type transistor, B is implanted with an implantation energy of 1-5 keV and an implantation amount of $5.0 \times 10^{14}$-$5.0 \times 10^{15}$ cm$^{-2}$.

For forming an n type transistor, As is implanted with an implantation energy of 5-25 keV and an implantation amount of $1.0 \times 10^{15}$-b $5.0 \times 10^{15}$ cm$^2$.

The cap layer 14 is removed by etching using phosphoric acid (H$_2$PO$_4$) at 150-180 Centigrade.

Subsequently, the first silicide layer 11 is formed on the gate electrode 4, and the second silicide layer 12 is formed on the source/drain region 9. As a result, the semiconductor device as shown in FIG. 1 is provided.

The first and second silicide layers 11 and 12 are formed by sputtering a metal layer such as Ni or the like on the gate electrode 4 and the source/drain region 9 and reacting the metal layer and the gate electrode 4 and the source/drain region 9 with RTA at 400-500 Centigrade, after removing a natural oxide on the gate electrode 4 and the source/drain region 9. Unreacted metal is removed by a mixture of H$_2$O$_2$ and sulfuric acid. A TiN layer may be formed on the Ni layer.

In accordance with the semiconductor device in this first embodiment, a short channel effect is suppressed by the Halo region, and junction leak current does not occur, and an increase in the junction capacitance may be suppressed.

In case the Halo region is made of a crystal which has a different lattice constant from the Si substrate, strain is generated in the channel region of the MISFET. Consequently, carrier mobility is improved.

Second Embodiment

A second embodiment is explained with reference to FIGS. 3A-3D.

In this second embodiment, the manufacturing process is different from the first embodiment.

Figure 3A:
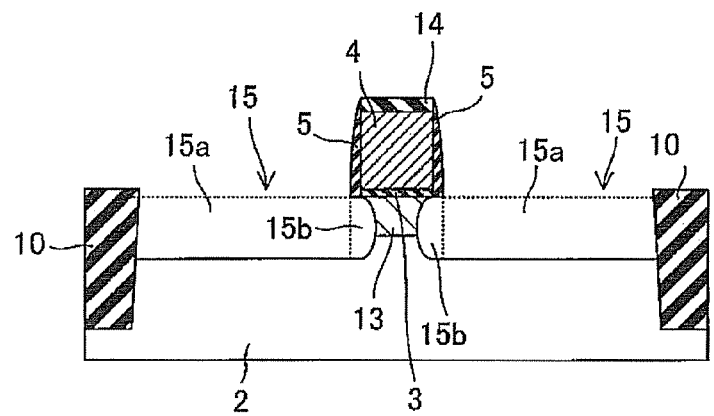
FIGS. 3A-3D are cross sectional views showing a manufacturing process of a semiconductor device in accordance with a second embodiment.

As shown in FIG. 3A, a process shown as FIGS. 2A-2C is provided and the recess 15 is formed in the Si substrate 2.

Figure 3B:
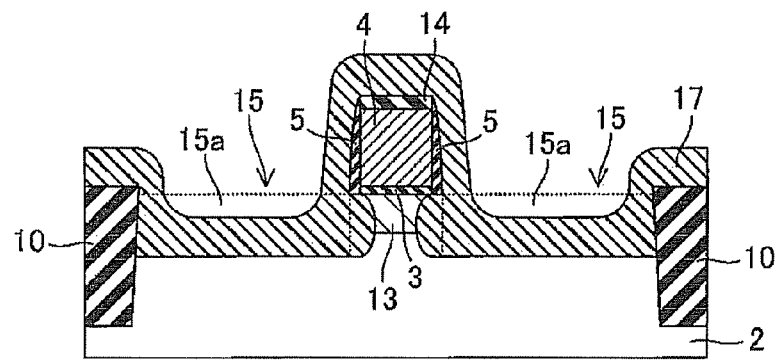

As shown in FIG. 3B, an amorphous layer 17 is formed on the first region 15a and the second region 15b of the recess 15 by LPCVD. In this step, the amorphous layer 17 is provided so as to fill the second region 15b of recess 15. The amorphous layer 17 may be an amorphous SiGe having n type impurity such as As, P, Sb or the like when the MISFET is p type transistor. The amorphous layer 17 may be an amorphous SiC or amorphous Si having p type impurity such as B, In or the like when the MISFET is n type transistor.

Figure 3C:
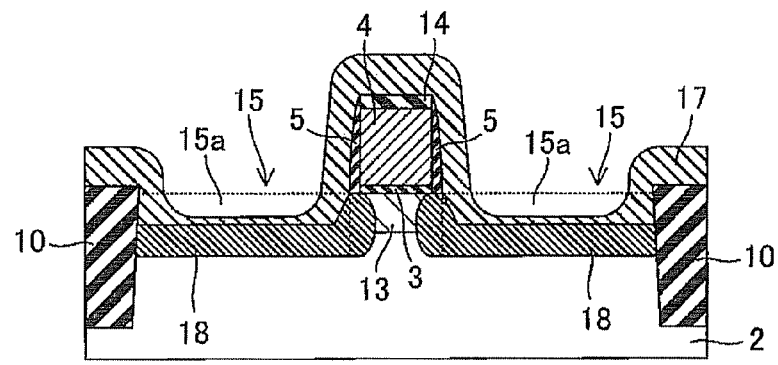

As shown in FIG. 3C, RTA at 700-850 Centigrade is provided and the amorphous layer 17 is crystallized from the boundary between the Si substrate and the amorphous layer 17. The impurity containing layer 18 is provided by solid phase epitaxial growth in the second region and a part of the first region of the recess 15.

Figure 3D:
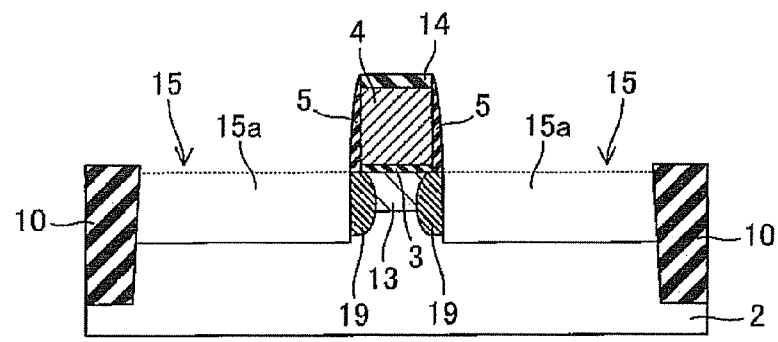

As shown in FIG. 3D, a part of the impurity containing layer 18 in the first region 15a of the recess 15 is removed by anisotropic etching using the offset spacer 5, the cap layer 14 and the STI 10 as a mask. As a result, the impurity containing layer 18 is provided in the second region 15b of the recess 15. Namely, the impurity containing layer 18 is provided below the gate electrode 4 and the offset spacer 5. Thus, the Halo region 19, which is the processed impurity containing layer 18, is formed below the gate electrode 4.

In accordance with the semiconductor device in this second embodiment, a Halo region is formed by a solid phase epitaxial growth method and the semiconductor device as described in the first embodiment is obtained.

Furthermore, an oxide concentration near the boundary between the Halo region 19 and the Si substrate 2 is increased compared to other regions. A thin SiO$_2$ layer may be provided between the Halo region 19 and the Si substrate 2. The diffusion of the conductivity ions in the Halo region 19 may be suppressed, since the oxide atoms may function as blocking the movement of the conductivity impurity. As a result, the second silicide layer 12 is hardly in contact with channel region 13.

Embodiments of the invention have been described with reference to the examples. However, the invention is not limited thereto.

Figure 4:
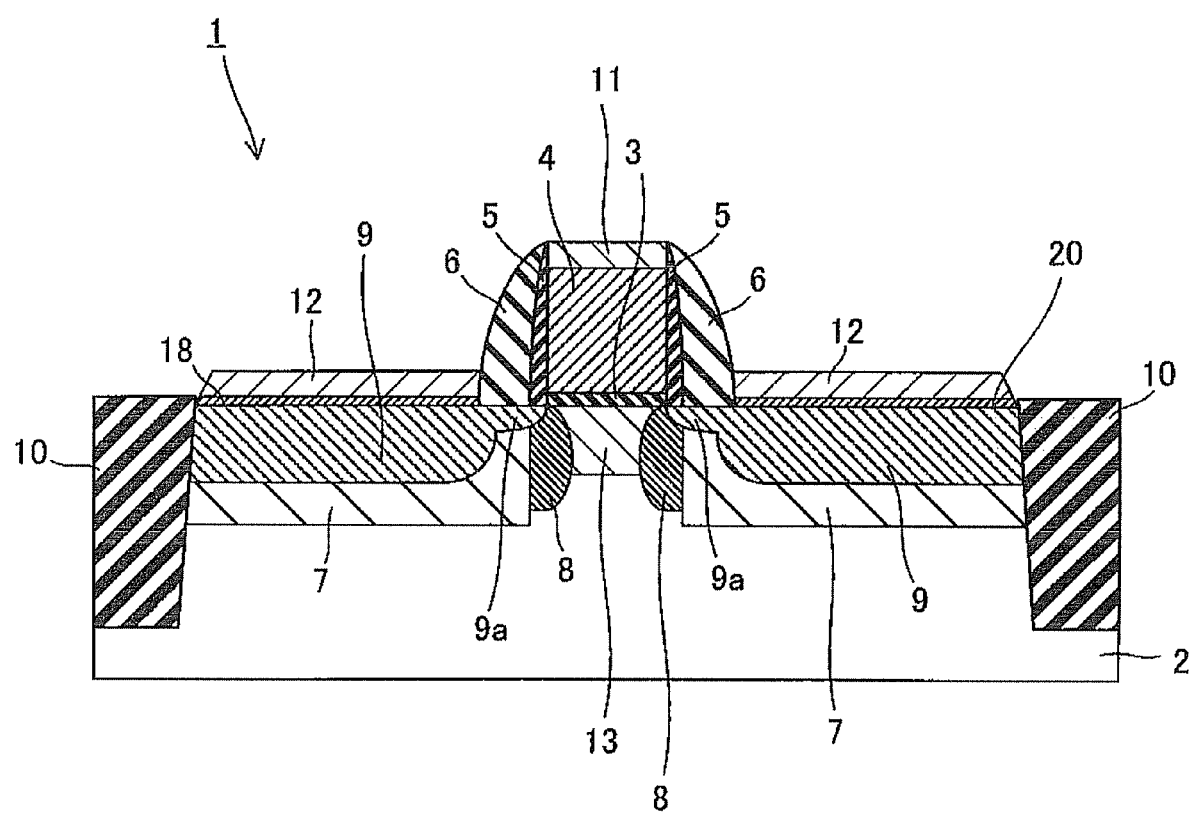
FIG. 4 is a cross sectional view of a semiconductor device in accordance with a modification of the first and second embodiment.

For example, the MISFET in the semiconductor device may have an elevated source/drain region 20 as shown in FIG. 4.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device, comprising:
  a Si substrate;
  a gate electrode provided on the semiconductor via a gate dielectric layer;
  a first epitaxially grown layer provided on the Si substrate and being in contact with the Si substrate;
  a channel region provided in the Si substrate below the gate electrode;
  a source/drain region provided in the first epitaxially grown layer sandwiching the channel region, and having a first conductivity type impurity;
  a second epitaxially grown layer provided between the channel region and the first epitaxially grown layer, and not provided under the first epitaxially grown layer, and provided below the gate electrode, and having a second conductivity type impurity opposite to the first conductivity type.

2. The semiconductor device of claim 1, wherein the first epitaxially grown layer is a crystalline having a different lattice constant from Si crystalline.

3. The semiconductor device of claim 1, wherein the second epitaxially grown layer is a crystalline having a different lattice constant from Si crystalline.

4. The semiconductor device of claim 2, wherein the first epitaxially grown layer is at least one of SiGe or SiC crystal layer.

5. The semiconductor device of claim 3, wherein the first epitaxially grown layer is at least one of SiGe or SiC crystal layer.

6. The semiconductor device of claim 1, wherein a part of the source/drain region is provided in the second epitaxially grown layer.

* * * * *